(12) United States Patent
Brown et al.

(10) Patent No.: US 8,754,972 B2
(45) Date of Patent: Jun. 17, 2014

(54) INTEGRATED MULTI-CHANNEL ANALOG FRONT END AND DIGITIZER FOR HIGH SPEED IMAGING APPLICATIONS

(75) Inventors: David L. Brown, Los Gatos, CA (US);
Mansour Kermat, San Jose, CA (US);
Lance Glasser, Saratoga, CA (US);
Henrik Nielsen, San Jose, CA (US);
Guowu Zheng, Cupertino, CA (US);
Kurt Lehman, Menlo Park, CA (US);
Kenneth F. Hatch, Sunol, CA (US);
Alex Chuang, Cupertino, CA (US);
Venkatraman Iyer, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 319 days.

(21) Appl. No.: 13/364,308

(22) Filed: Feb. 1, 2012

(65) Prior Publication Data
US 2013/0194445 A1  Aug. 1, 2013

(51) Int. Cl.
*H04N 5/335* (2011.01)
*H04N 5/228* (2006.01)
(52) U.S. Cl.
USPC .......................................... 348/295; 348/300
(58) Field of Classification Search
CPC ..... H04N 3/15; H04N 5/372; H04N 5/37206; H04N 5/3743
USPC .................................................. 348/294–324
See application file for complete search history.

(56) References Cited

U.S. PATENT DOCUMENTS

| | | | |
|---|---|---|---|
| 2001/0055424 A1* | 12/2001 | Publicover | 382/195 |
| 2004/0012684 A1* | 1/2004 | Tinnerino | 348/208.1 |
| 2004/0032628 A1* | 2/2004 | Sato et al. | 358/514 |
| 2007/0064135 A1 | 3/2007 | Brown et al. | |
| 2007/0171298 A1* | 7/2007 | Kurane | 348/362 |
| 2007/0229677 A1* | 10/2007 | Mochizuki et al. | 348/229.1 |
| 2008/0074513 A1* | 3/2008 | Noguchi | 348/243 |
| 2009/0009645 A1 | 1/2009 | Schrey et al. | |
| 2010/0104173 A1 | 4/2010 | Yoshida et al. | |
| 2010/0188655 A1 | 7/2010 | Brown et al. | |
| 2011/0019044 A1 | 1/2011 | Wang et al. | |
| 2011/0279725 A1 | 11/2011 | Cazaux et al. | |

* cited by examiner

*Primary Examiner* — Twyler Haskins
*Assistant Examiner* — Dwight C Tejano
(74) *Attorney, Agent, or Firm* — Bever, Hoffman & Harms, LLP; Jeanette S. Harms

(57) ABSTRACT

A module for high speed image processing includes an image sensor for generating a plurality of analog outputs representing an image and a plurality of HDDs for concurrently processing the plurality of analog outputs. Each HDD is an integrated circuit configured to process in parallel a predetermined set of the analog outputs. Each channel of the HDD can include an AFE for conditioning a signal representing one sensor analog output, an ADC for converting a conditioned signal into a digital signal, and a data formatting block for calibrations and formatting the digital signal for transport to an off-chip device. The HDDs and drive electronics are combined with the image sensor into one package to optimize signal integrity and high dynamic range, and to achieve high data rates through use of synchronized HDD channels. Combining multiple modules results in a highly scalable imaging subsystem optimized for inspection and metrology applications.

39 Claims, 15 Drawing Sheets

INTEGRATED MULTI-CHANNEL ANALOG FRONT END AND DIGITIZER FOR HIGH SPEED IMAGING APPLICATIONS

BACKGROUND OF THE INVENTION

1. Field of the Invention

The present invention relates to high speed imaging using time delay integration (TDI) sensors and in particular to an analog front end (AFE) and an analog to digital converter (ADC) that can be used in conjunction with the TDI sensors to form a high density digitizer (HDD).

2. Related Art

Time delay integration (TDI) is an image scanning process that produces a continuous image of a moving two-dimensional object. In a TDI system, image photons are converted to photocharges in a two-dimensional array of pixels. As the object is moved, the photocharges are shifted from pixel to pixel down the sensor, parallel to the axis of movement. By synchronizing the photocharge shift rate with the velocity of the object, the TDI can integrate signal intensity at a fixed position on the moving object to generate the image. The total integration time can be regulated by changing the speed of the image motion and providing more/less pixels in the direction of the movement. TDI inspection systems can be used for inspecting wafers and/or reticles.

Conventional inspection systems configure TDI sensors to drive pre-amplifiers and analog-to-digital converter (ADC) devices through long traces. These long traces can introduce noise and loading, both of which can undesirably reduce system performance. The signal level is also obtained in digital domain by subtracting two consecutive samples. This subtraction results in the ADC operating at twice the sampling rate and also more thermal and quantization noise, which results in a lower signal-to-noise ratio (SNR). Moreover, the high channel count (resulting from reading out sets of pixels in parallel) and high-density requirements associated with high-speed TDI sensors generally increase board complexity and expense.

Therefore, a need arises for a compact multi-channel analog front end and digitizer for high speed imaging applications.

SUMMARY OF THE INVENTION

A module for high speed image processing can include an image sensor and a plurality of high density digitizers (HDDs). The image sensor can generate a plurality of analog outputs representing an image. In one embodiment, the image sensor can include a time delay integration (TDI) sensor, which can sense a range of wavelengths from deep ultraviolet through visible radiation. The HDDs can concurrently process the plurality of analog outputs. Each HDD can be implemented as an integrated circuit. Notably, each HDD can process in parallel a predetermined set of the analog outputs representing a portion of the image. These HDDs can achieve high average data rates while maintaining high signal-to-noise ratios.

Each channel of the HDD can include an analog front end (AFE) and an analog-to-digital converter (ADC). The AFE can condition a signal (in one embodiment, a differential signal) representing one sensor analog output. The ADC can convert the resulting conditioned signal into a digital signal. The AFE can include a programmable gain amplifier (PGA) with switch-out capacitors. In one embodiment, the PGA can include a plurality of comparators for determining when each of the switch-out capacitors is to be disconnected from an input of the PGA.

Other embodiments of an HDD can include other performance enhancing features. For example, a data rate multiplier phase locked loop (PLL) can be included in the module and configured to provide a square wave to which all channel outputs are phase locked. The AFE can be configured to convert a single-ended signal to a differential signal, which has high immunity to substrate noise and also increases the swing of the signal and enhance the signal-to-noise ratio (SNR) of the system. The AFE can also include a correlated double sampling (CDS) circuit with offset control to optimize dynamic range. The clocking of the CDS circuit can be reconfigurable, thereby allowing one reset and multiple readings to provide averaging and increase of the system SNR. A data formatting block of the HDD can be configured to provide black-level correction. The HDD can further include a low voltage differential signaling (LVDS) block for receiving outputs of the data formatting block and providing transport of output data to the off-chip device. In one embodiment, each channel can include an analog driver coupled to bypass the ADC and provide the conditioned signal to an off-chip device.

The HDD can further include a control block for enabling/disabling a calibration mode and a test mode. In one embodiment, the control block can include a ramp generator for providing a ramp signal to each ADC. In another embodiment, the control block can include self-test logic configured to introduce a predetermined ramp function to each channel and monitor output pins of the HDD for deviations from the predetermined ramp function, to introduce a DC value to each channel and monitor output pins of the HDD for noise on each channel, and/or to introduce a known signal pattern to each channel and monitor output pins of the HDD to determine when the known signal pattern starts and ends.

HDD can also include a sensor block for selectively accessing and monitoring a digital input voltage, an inner chip voltage, a peripheral chip voltage, and a temperature sensor voltage. This sensor block can include a temperature sensor that can measure precisely the on-chip temperature. Because multiple HDD dies can be provided in one package, the sensor block can be used to generate a thermal map of the HDD package, which can then be used for debugging purpose.

The HDD can further include a register control block for providing general and channel configuration bits to the HDD. Advantageously, the register control block can provide interlinking of the plurality of HDDs. The configuration bits of the registers of the register control block can be programmed/accessed serially or in parallel.

A system for high speed image processing is also described. This system can include a plurality of modules configured as described above. The plurality of HDDs can be connected for selectively providing general and channel configuration bits to the HDDs. The system can include a package for securing the image sensor and the plurality of HDDs. These HDD dies can be attached to the package through standard "bumps", i.e. flip-chip technology. In one embodiment, the image sensor and the plurality of HDDs can be coupled using wire bonds, wherein the package includes in-package capacitors. These in-package capacitors form part of the overall grounding scheme of the package and can advantageously maintain high signal integrity and minimize channel crosstalk in the HDDs.

The module and system described herein can achieve high signal integrity, overall reliability, and lower material and assembly costs.

Additional features and associated advantages of the present invention will be illustrated in the following drawings and detailed description.

DETAILED DESCRIPTION OF THE DRAWINGS

Figure 1:
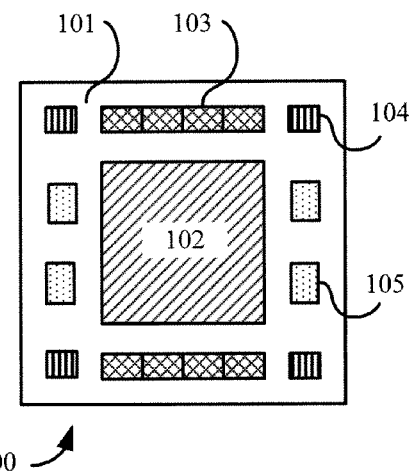
FIG. 1 illustrates a top view of an exemplary TDI sensor module that includes localized driving and signal processing circuitry.

FIG. 1 illustrates a top view of an exemplary TDI sensor module 100 that includes localized driving and signal processing circuitry (also called localized circuits herein). Specifically, TDI sensor module 100 includes a TDI sensor 102, processing circuits 103 for processing the signals from TDI sensor 102, timing and serial drive circuits 104, and pixel gate driver circuits 105.

In one embodiment, processing circuits 103 can provide correlated double sampling (CDS) and other analog front end (AFE) functions (e.g. analog gain control or DC offset), analog to digital conversion (ADC), and digital post-processing such as black-level correction, per pixel gain and offset corrections, linearity corrections, look-up tables (LUTs), and data compression. The processing may be fixed or rely on additional, possibly real-time, input from the inspection system to perform functions such as sub-pixel interpolation, analog gain control to prevent digital saturation, image position shifting, and image spatial distortion correction.

The timing and serial drive circuits 104 can control clock timing and drive for TDI. Features such as reset pulse generation, multi-phase serial-register clock generation, and ADC synchronization may be included. This allows for very accurate timing which is needed to achieve high SNR at high clocking speeds.

The pixel gate driver circuits 105 provide slower but higher-current TDI gate drive signals to synchronize data capture with the inspection image motion and with other TDI sensors. Pixel gate driver circuits 105 may typically provide three-phase or four-phase drive waveforms of square-wave and/or sinusoidal waveforms. More generally, pixel gate driver circuits 105 may use digital-to-analog conversion to provide arbitrary function generation in order to optimize the charge transfer, thermal dissipation, and SNR of the sensor.

Localized driving circuits mean that each TDI sensor module has its own individual set of drivers (i.e. drivers 104 and 105). These individual drivers require significantly less current, and thus can be significantly smaller than conventional large-area TDI sensor drivers. Notably, locally distributing high fidelity, high-current waveforms from a plurality of small drivers (associated with the TDI sensor modules) is much more scalable than distributing waveforms from one large driver, even when the total current requirement is the same.

In one embodiment, each of processing circuits 103, timing and serial drive circuits 104, and pixel gate drive circuits 105 can be implemented on integrated circuits (ICs) positioned around TDI sensor 102 on a PCB (printed circuit board) 101. Note that the number of ICs used to implement the driving/processing circuits can vary based on embodiment. In one embodiment, PCB 101 can be implemented using a multi-layer, ceramic substrate.

In one embodiment, digital data from TDI sensor module 100 can be transmitted off-board using a programmable, low voltage differential signaling (LVDS), or similar electrical signaling and digital multiplexing. The specific protocol can be selected from an industry standard or prescribed by those skilled in the art of electronic or optical high-speed digital communications. In one embodiment, drive programmability can be added to reduce the digital noise to the LVDS for specific package traces.

Figure 2:
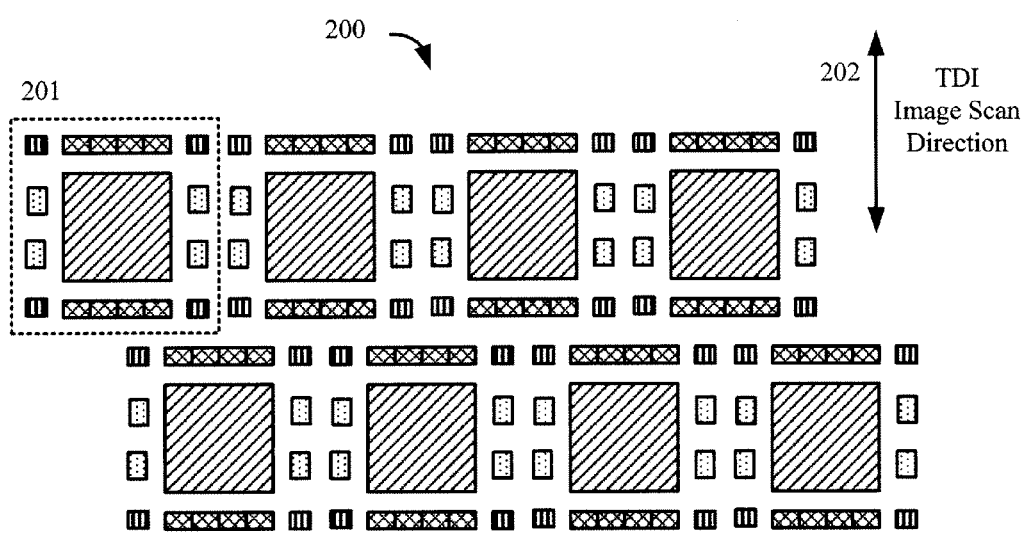
FIG. 2 illustrates an exemplary modular array of TDI sensor modules.

FIG. 2 illustrates an exemplary modular array 200 of TDI sensor modules 201 (hereinafter called a modular sensor array). Note that the driving/processing circuits positioned around the TDI sensor take up a predetermined space. Thus, the TDI sensors in adjacent rows can be aligned such that at least 100% image coverage is achieved when used in a continuous scanning configuration. For example, in the embodiment shown in FIG. 2, each row can be offset with respect to an adjacent row such that the TDI sensor is positioned in the same vertical space as the driving/processing circuits of an adjacent row. To ensure no gaps in image coverage, the width of each TDI sensor is equal to or greater than the space between TDI sensors. In this configuration, as the inspected wafer/mask/reticle is being moved in a TDI image scan direction 202, modular sensor array 200 can ensure at least 100% image capture.

Note that the effective data rate for modular array 200 can be significantly higher than a single, large TDI sensor. This rate is achieved because the modular array can have an effective total size and number of output channels that is larger than can be practically manufactured in a single TDI sensor. Further note that any number of rows of TDI sensor modules can be included in a modular array, i.e. TDI sensor modules facilitate scaling. U.S. patent application Ser. No. 12/575, 376, entitled "TDI Sensor Modules With Localized Driving And Signal Processing Circuitry For High Speed Inspection" and filed on Oct. 7, 2009 by KLA-Tencor Corporation, describes TDI sensor modules and modular sensor arrays in greater detail, and is incorporated by reference herein.

Figure 3:
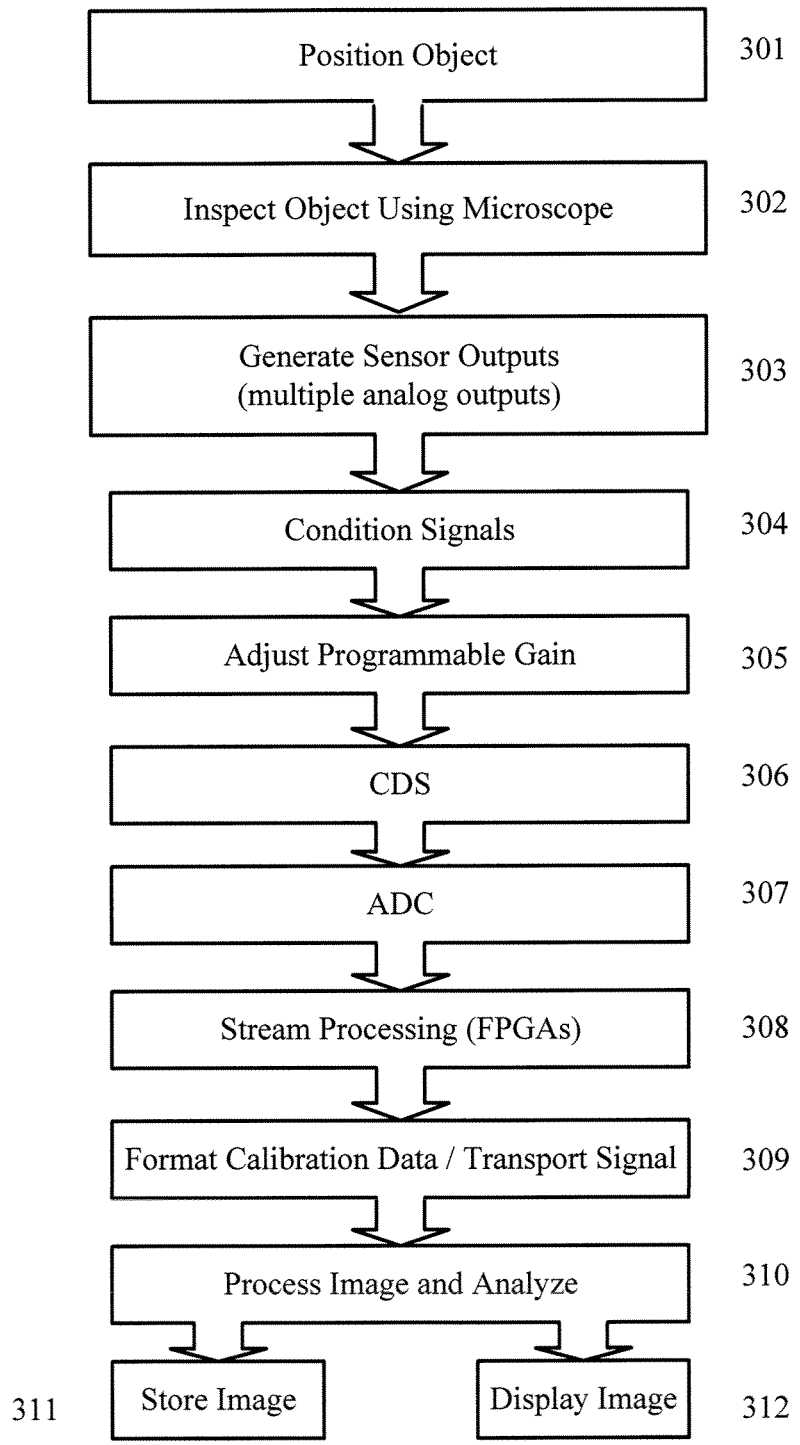
FIG. 3 illustrates an exemplary inspection technique using TDI sensor modules.

FIG. 3 illustrates an exemplary inspection technique using TDI sensor modules. Step 301 can position an object (e.g. a reticle, mask, or integrated circuit) for inspection. Step 302 can begin inspection of the object, for example using a microscope. Step 303 can generate TDI sensor outputs, i.e. multiple analog outputs.

Step 304 can condition these analog outputs and step 305 can adjust the programmable gain of these outputs, if necessary to optimize the conditioning. Step 306 can perform correlated double sampling (CDS), which is a known process that measures electrical values (i.e. voltages or currents) in order to remove an undesired offset. In CDS, the output of a sensor is measured twice, the first measurement during a known condition and the second measurement during an unknown condition. The first measurement can then be subtracted from the second measurement, thereby providing a value that can be used to correct for offset.

Step 307 can perform analog-to-digital conversion (ADC) using the offset-corrected measurements. Step 308 can process the digitized data into streams of data. In one embodiment, programmable logic devices, such as field programmable gate arrays (FPGAs), can be configured to generate these streams of data. Step 309 can format the streams of calibration data and transport the resulting signals to a processing device. Step 310 can process and digitize the data into images and perform analysis of the images. Exemplary analysis includes defect inspection and/or feature identification. Step 311 can store the images, while step 312 can display one or more images for user review. Note that TDI sensor module 100 can implement steps 303-309, whereas other components in an inspection system can implement steps 301-302 and 310-312.

High-speed imaging is highly desirable in inspection systems. However, ensuring such high-speed imaging can be particularly challenging when generating images from TDI sensors. As described in further detail below, one aspect of an improved inspection system using TDI sensors (or other image sensors generating multiple, parallel analog outputs, called TDI sensors for simplicity herein) includes the efficient conversion of parallel analog signals into digital data and the efficient transportation of this digital data into the signal processing path.

Figure 4:
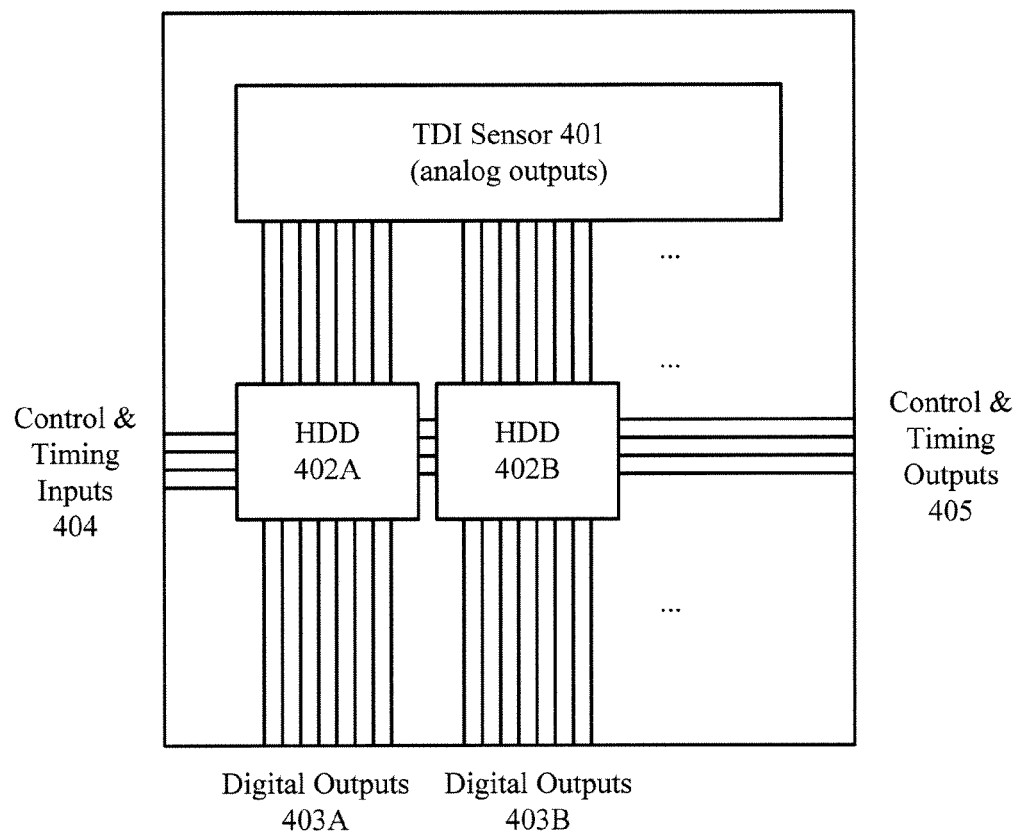
FIG. 4 illustrates exemplary inputs and outputs of two high-density digitizers, which form part of the processing circuits of a TDI sensor module.

FIG. 4 illustrates a portion of a TDI sensor module, specifically two high-density digitizers (HDDs) 402A and 402B, which can form part of processing circuits 103, and a TDI sensor 401. In one embodiment, HDDs 402A and 402B (for implementing steps 304-307) can receive the analog outputs generated by TDI sensor 401 (for implementing step 303) as well as control and timing inputs 404. HDDs 402A and 402B can generate digital outputs 403A and 403B, respectively, which pertain to specific regions of the total image. In one embodiment, based on system configuration, HDDs 402A and 402B can also generate control and timing outputs 405.

Advantageously, digital outputs 403A and 403B, which are output in parallel, can provide a large optical image field of view for inspection. Generating multiple digital outputs in parallel also facilitates achieving high data rates. Specifically, one conventional configuration for reading an output of an image sensor shifts a row of digital (pixel) data to a shift register, which in turn shifts out data serially one bit (one pixel) at a time. In contrast, in accordance with the configuration shown in FIG. 4, each HDD can output multiple sets of digital bits (pixel values) in parallel. Advantageously, these parallel outputs allow relatively slow operation per channel, thereby maximizing the signal-to-noise ratio (SNR), while allowing a very high total system data rate for all channels (i.e. based on a plurality of bits (pixel data) being effectively output in parallel).

Figure 5:
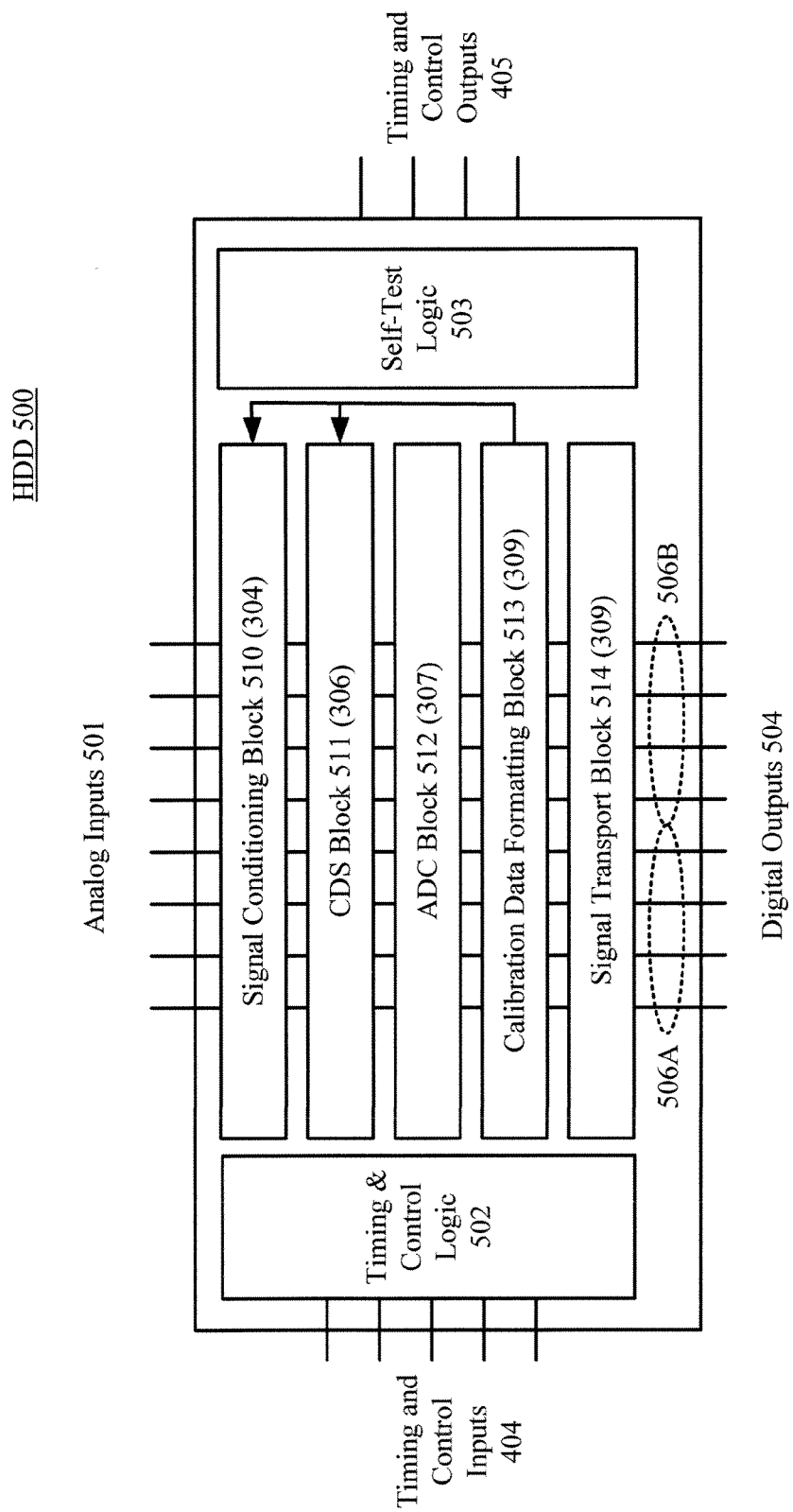
FIG. 5 illustrates a functional block diagram of an HDD.

FIG. 5 illustrates a functional block diagram of a high density digitizer (HDD) 500. HDD device 500 can include timing and control logic 502 that receives the previously-described timing and control inputs 404 (FIG. 4). In one embodiment, timing and control logic 502 can provide timing and control inputs 404 to one or more channels (described below) to compensate for propagation delay or other local requirements. Timing and control inputs 404 can also be provided to components that globally control the HDD (e.g. providing test/operational modes). For example, HDD device 500 can also include self-test logic 503 that receives some of timing and control inputs 404 and generates some of timing and control outputs 405. In one embodiment, timing and control outputs 405 can be used for monitoring and/or controlling other TDI sensor modules in an efficient manner.

HDD 500 can include blocks that perform steps 304-309. For example, signal conditioning block 510 can perform step 304, CDS block 511 can perform step 306, ADC block 512 can perform step 307, calibration/data formatting block 513 can perform step 309, and signal transport block 514 can perform step 309. Note that only components performing steps 304, 306, 307, and 309 are shown for simplicity. In an actual implementation, HDD 500 can include additional components to perform other steps and provide additional functionality.

Moreover, in other embodiments, blocks 510-514 can perform additional functionality. For example, in one embodiment, signal conditioning block 510 can provide current sinking, level shifting for the voltage domain, offset level adjustment, buffering, single-ended to differential conversion, and robust electrostatic discharge damage (ESD) control. Correlated double sampling (CDS) block 511 can remove several sources of noise found in sensor processing, e.g. low-frequency noise and/or reset noise. ADC block 512 can advantageously digitize signals from multiple channels (e.g. the 8 exemplary channels shown for purposes of illustration) in parallel, thereby providing uniform performance across HDD 500. This uniform performance is particularly desirable in an inspection or metrology system. Calibration data formatting block 513 can perform real-time processing, such as black-level correction, drift-compensation, and/or other calibration processes known in the art of high-performance imaging. Calibration data formatting block 513 can also perform digital signal processing calculations that access previous measurements and predict future data. In one embodiment, the results of this real-time processing can be fed back into the analog front-end (AFE) (e.g. signal conditioning block 510 and CDS block 511) to control conditioning, gain control, and sampling as needed. In one implementation, such real-time processing can be performed by one or more FPGAs, CPUs, or dedicated processing devices (i.e. external devices).

Signal transport block 514 can receive the formatted data from data formatting block 513 and generate digital outputs 504. Notably, because digital outputs 504 are more immune to noise than analog signals, in one embodiment, sets of digital outputs 504 can be created (e.g. by merging channel data) with minimal data accuracy loss. However, note that merged digital output can affect the quality of the analog input by coupling through the silicon substrate as well as I/O ring and ESD devices.

FIG. 5 shows sets 506A and 506B that could be merged to form digital outputs 504. This merged digital data can be sent at high data rates (e.g. using high speed interconnect).

Merged digital data also advantageously uses fewer pins of HDD 500 (e.g. in the case of either set 506A or 506B, one fourth of the original pin count). Thus, using localized ADC and output multiplexing in HDD device 500 can significantly improve system performance and resource management.

Figure 6A:
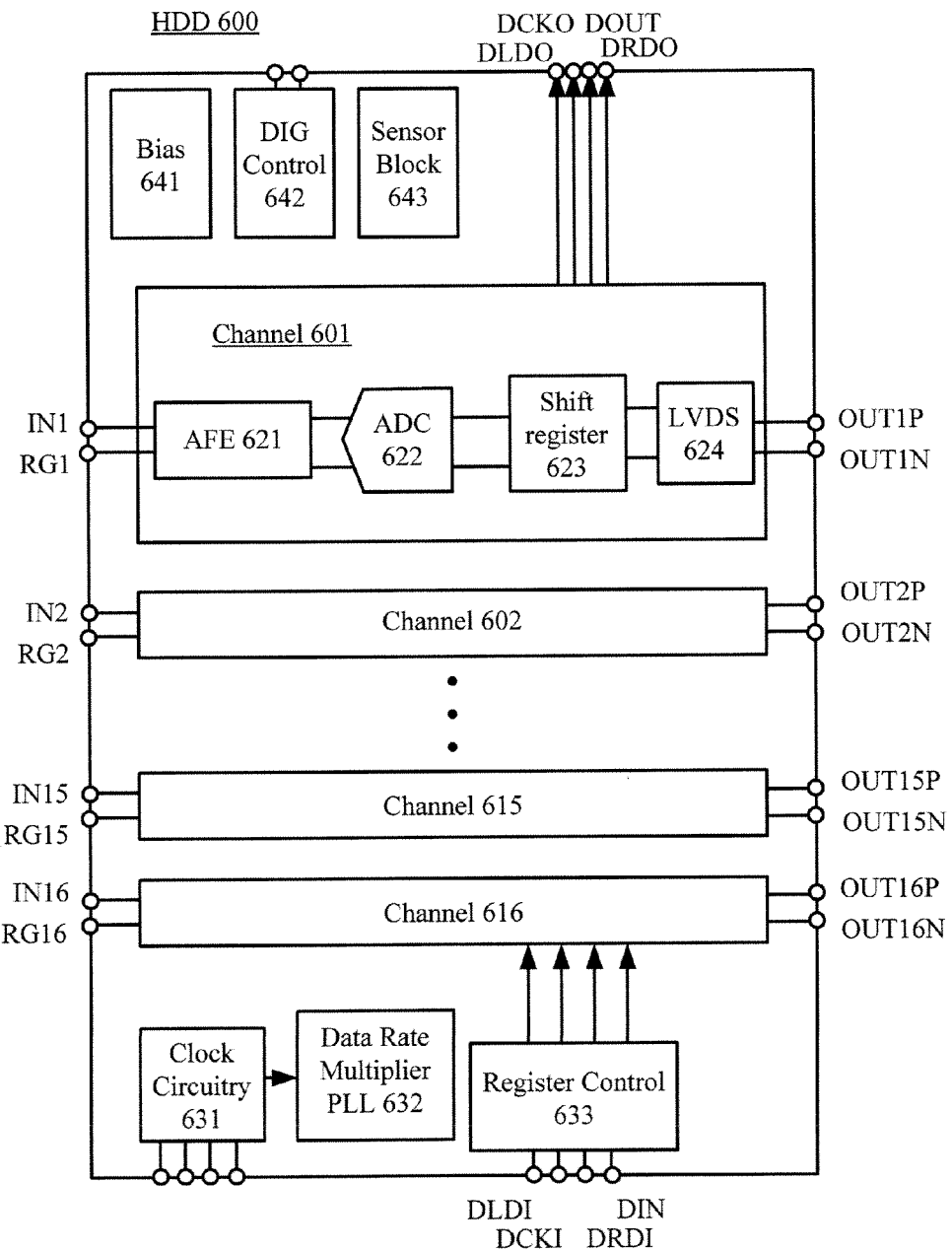
FIGS. 6A and 6B illustrate the channels and pins of exemplary HDDs.

FIG. 6A illustrates the channels and pins of an exemplary HDD 600. Although HDD 600 includes 16 channels, i.e. channels 601-616, other HDDs may include fewer channels (e.g. 8 channels) or more channels (e.g. 32 or 64 channels). Exemplary components of the channels are shown in channel 601. For example, each channel can include an analog front end 621, which receives sensor input signals. In FIG. 6, channel 601 receives sensor input signals IN1 and RG1 and channel 616 receives sensor input signals IN16 and RG16. Sensor input signal IN refers to an analog input signal, whereas sensor input signal RG refers to a reference ground signal associated with that channel. In one embodiment, AFE 621 can include one or more analog filters for smoothing waveforms and/or removing DC levels, CDS circuitry, single-ended to differential converters, gain adjustment circuitry, and other signal conditioning components.

An ADC 622 can convert the processed analog signals from AFE 621 into digital signals. The digital outputs from ADC 622 can be stored in a shift register 623. In one embodiment, a low voltage differential signaling (LVDS) block 624 can receive the outputs of shift register 623 and then generate two different voltages OUTP and OUTN, which can be compared off-chip. In FIG. 6, for example, channel 601 can output OUT1P and OUT1N, whereas channel 616 can output OUT16P and OUT16N. LVDS 624 can effectively use this difference to encode information. Note that LVDS is a standard output format for high speed networks/busses and therefore is not described further herein. Notably, the differential signaling configuration helps to reduce the effect of the output signals on the input signal integrity.

Figure 6B:
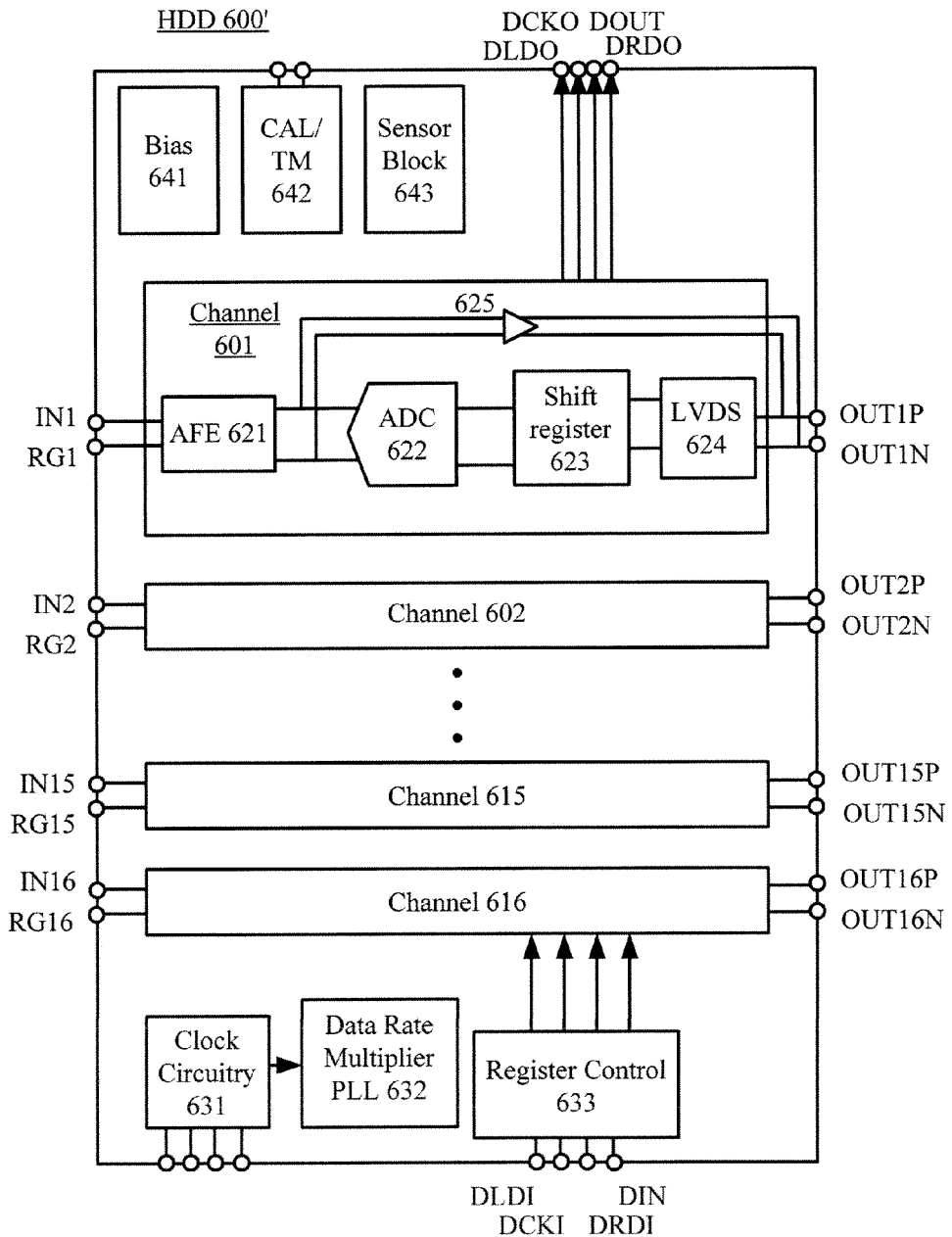

FIG. 6B illustrates the channels and pins of another exemplary HDD 600'. In HDD 600', each channel further includes an analog driver 625, which has its inputs connected to the outputs of AFE 621 and its outputs connected to the output pins (i.e. the pins providing OUTP and OUTN). In this configuration, when analog driver 625 is activated, ADC 622, shift register 623, and LVDS 624 can be bypassed, thereby allowing analog signals to be output by the channel. Thus, either analog or digital data can be sent to the next processing stage (external to HDD 600). Note that analog signals can be sent off-chip for additional analog processing, whereas digital signals can be sent off-chip after optional digital correction, digital signal processing, and formatting.

HDD 600 (or HDD 600') can further includes a register control block 632 that can receive digital input signals DLDI (digital load data input), DI (digital read data input), DIN (data in), and DCKI (digital clock input). These digital input signals can traverse HDD 600 (in various manners, as described below in FIGS. 7, 8A, and 8B) and eventually are output as digital output signals DLDO (digital load data output), DRDO (digital read data output), DOUT (data out), and DCKO (digital clock output).

Additional circuits integrated on HDD device 600 can include clock circuitry 631 and an associated data rate multiplier phase locked loop (PLL) 632, biasing circuitry 641, calibration and test mode block 642, a sensor block 643, and a digital control block 644. Clock circuitry 631 can provide delays for clock signals when necessary, e.g. to adjust the delay to when the actual CDS occurs (as can be indicated by a received trigger signal). Using a square wave of a predetermined frequency (e.g. a reference waveform generated by clock circuitry 631), data rate multiplier PLL 632 can ensure that all channel outputs are phase locked to that square wave (or a multiplier of that square wave). Biasing circuitry 641 can generate a voltage bias VB (see FIG. 9A) as well as allow the differential amplifier to handle a unipolar signal range (i.e. 0 to max) instead of a bipolar signal range (i.e. −max/2 to +max/2). In one embodiment, each channel may have a separate bias control capability.

Digital control 642 can enable/disable analog driver 625 (FIG. 6B), the digital driver associated with LVDS 624, the output pins (e.g. to save power), calibration, and/or test modes for the channels. An exemplary calibration could include introducing a predetermined ramp function on the input pins of HDD device 600 and monitoring the output pins to ensure that the same ramp function is output. Another exemplary calibration could include introducing a DC value on the input pins of HDD device 600 and monitoring the output pins for noise on each channel. Exemplary test modes include providing a known signal pattern to the channels and analyzing the digital output, thereby facilitating identification of when that pattern starts and ends. Once the start/end of a known pattern can be ascertained, then the channels can be programmed accordingly to accurately identify the start/end of signals during actual operation. In one embodiment, digital control block 642 can include a bit clock LVDS (associated with the on-chip bit line) and a word clock LVDS (associated with the on-chip word line), which can be used in well known techniques to synchronize on-chip data (e.g. during test mode and/or during calibration of specific channels).

Figure 7:
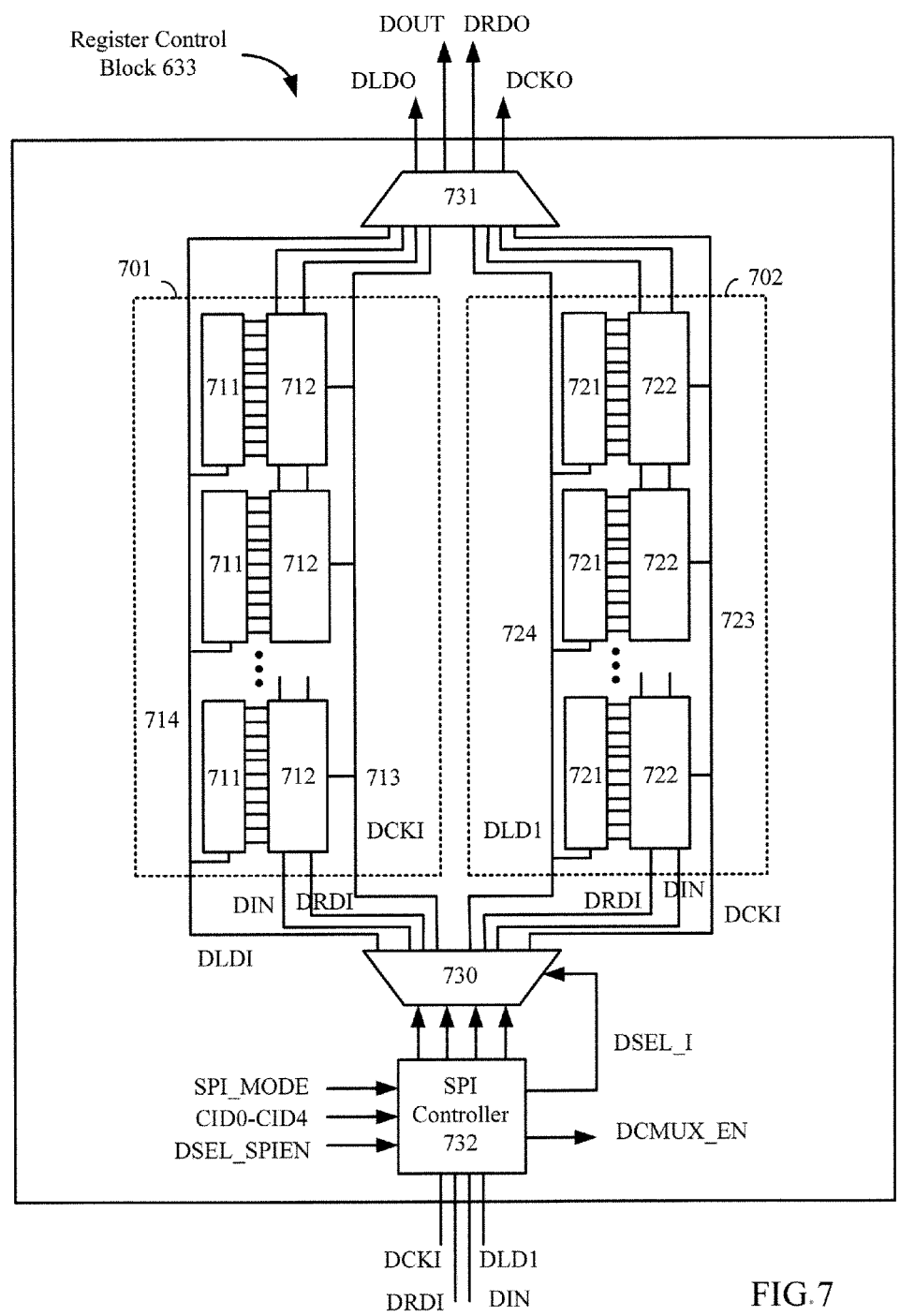
FIG. 7 illustrates an exemplary register control block, which can provide both general and channel configuration bits to the HDD.

FIG. 7 illustrates an exemplary configuration for register control block 633, which can be used to provide both general configuration bits and channel configuration bits to the HDD. In the embodiment of FIG. 7, two sets of registers are provided: a first set 701 for the general configuration bits and a second set 702 for the channel configuration bits.

A multiplexer 730 can be used to write bits DIN to either general configuration registers 711 (which may control the overall timing of the chip, the enabling/disabling of the output drivers, etc.) or channel configuration register 721 (which may control the gain for each channel or other channel-specific control signals). Circuits in the HDD can access the bits of configuration registers 711 and 721 via standard techniques. Bits DIN for general configuration registers 711 can be loaded into shift registers 712 using the clock signal DCKI on a clock line 713. Once all the general configuration bits are clocked into shift registers 712, the load signal DLDI on line 714 (i.e. DLDI) can trigger general configuration registers 711 to receive the values in shift registers 712 in parallel. Similarly, bits DIN for channel configuration registers 721 can be loaded into shift registers 722 using the clock signal DCKI on a clock line 723. Once all the channel configuration bits are clocked into shift registers 722, the load signal DLDI on line 724 can trigger general configuration registers 711 to receive the values in shift registers 712 in parallel. Note that although the first and second sets of registers 701 and 702 may have the same number of registers in some embodiments, in other embodiments the first and second sets of registers 701 and 702 can have different numbers of registers depending on circuits implemented on the HDD.

A multiplexer 731 can read the bits DOUT from the first set of registers 701, i.e. the general configuration bits, or from the second set of registers 702, i.e. the channel configuration bits. Specifically, the read signal DRDI can trigger shift registers 712 to load the values from general configuration registers 711, wherein such bits can then be clocked out of shifter registers 712 using the clock signal DCKI and appropriate output selection by multiplexer 731. Similarly, the read signal DRDI can trigger shift registers 722 to load the values from channel configuration registers 721, wherein such bits can then be clocked out of shifter registers 722 using the clock signal DCKI and appropriate output selection by multiplexer 731. Notably, these output bits can be propagated through multiple HDDs either serially or in parallel as described in reference to FIGS. 8A and 8B, respectively.

Figure 8A:
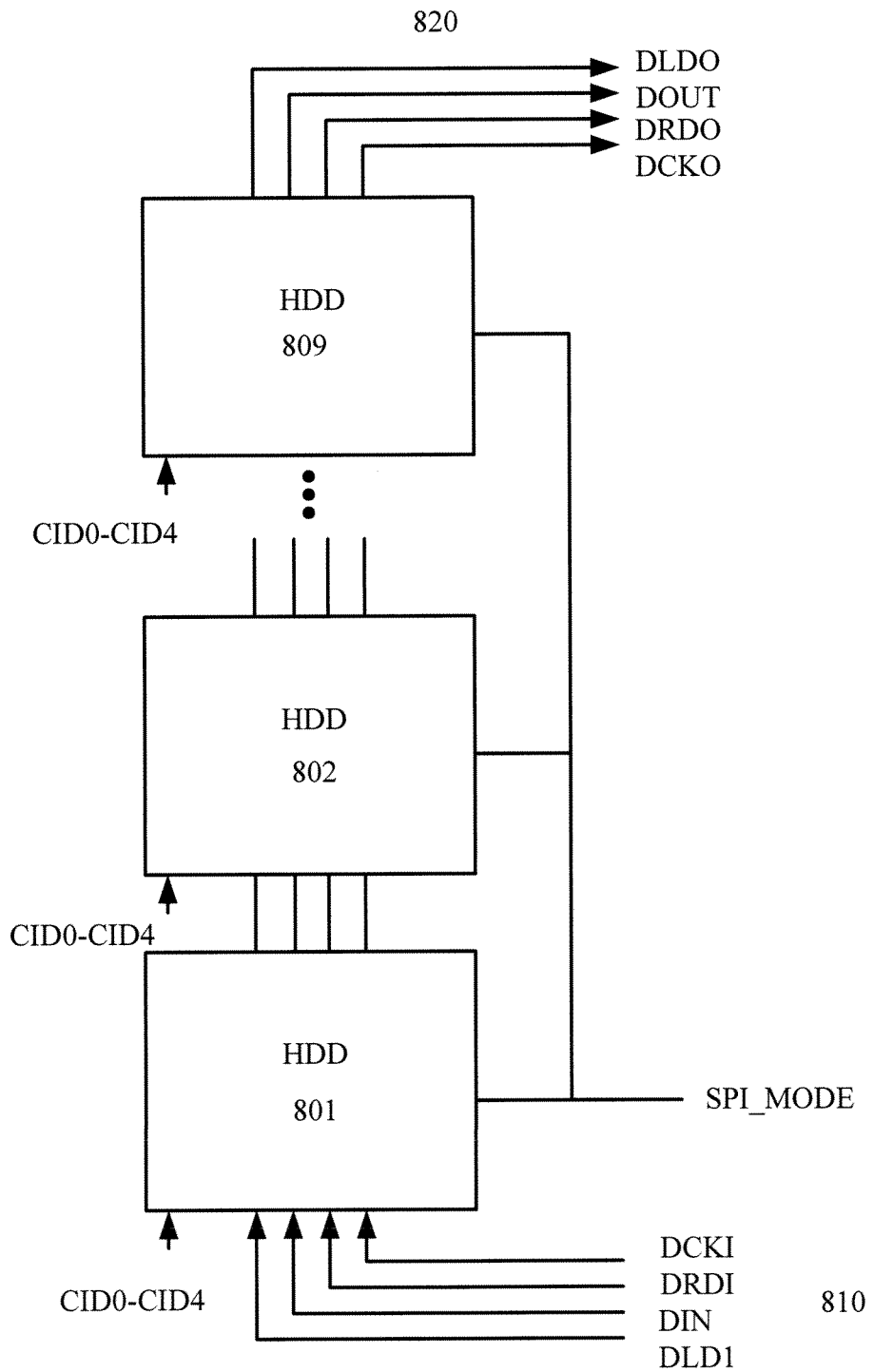
FIGS. 8A and 8B illustrate exemplary configurations in which a plurality of HDDs can be connected in series or in parallel, respectively, to transfer the general and channel configuration bits.

FIG. 8A illustrates an exemplary configuration in which a plurality of HDDs 801-809 can be serially connected to receive inputs 810 for the general control circuitry or the channel control circuitry (e.g. using multiplexers 730 and 731, FIG. 7). Note that the outputs from HDDs 801-808 form the inputs to HDDs 802-809. Although 9 chips are indicated in FIG. 8A, other embodiments may have more or fewer HDDs in a daisy chain configuration. Notably, the use of shift registers (described above) allows the HDDs to be chained together to any arbitrary length. Outputs 820 from the last HDD in the chain, in this embodiment, HDD 809, can be read back to an FPGA or another controller device.

Each HDD may also be given a unique fixed input pattern on CID0-CID4, which can be used to uniquely identify and address each device. The pattern may generated by connecting some or all of CID0-CID4 to ground. SPI_MODE input may then be used to select parallel addressing mode for writing and reading registers.

Figure 8B:
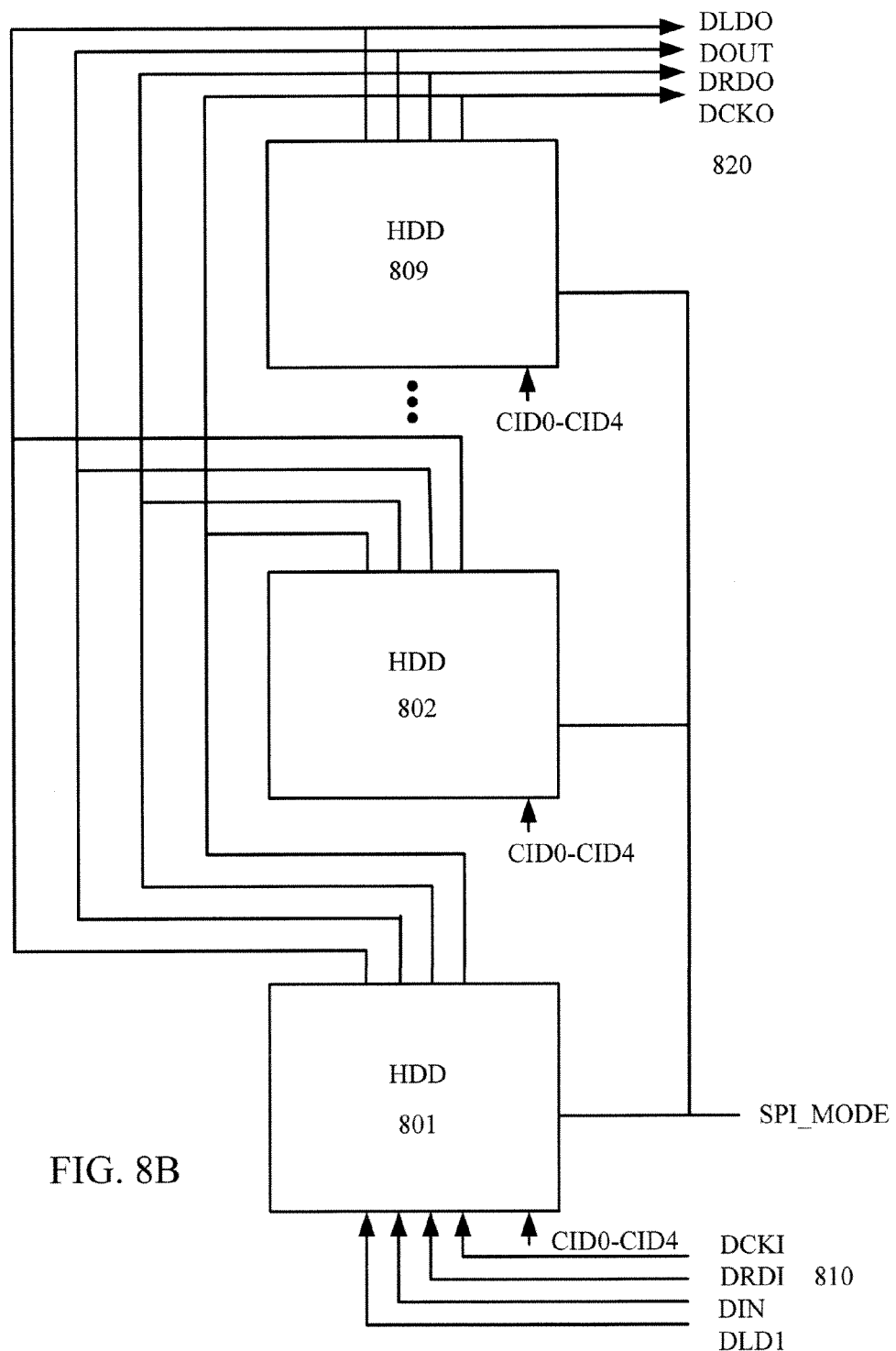

In one embodiment shown in FIG. 8B, HDDs 801-809 can be connected in parallel to receive inputs 810. In this configuration, instead of a daisy chain, each HDD in the TDI sensor package can be individually addressable, e.g. bits for the general control circuitry and the channel control circuitry can be sent over a bus with a set of lines provided for each HDD. This configuration can facilitate the reprogramming of individual HDDs (chips).

Figure 9A:
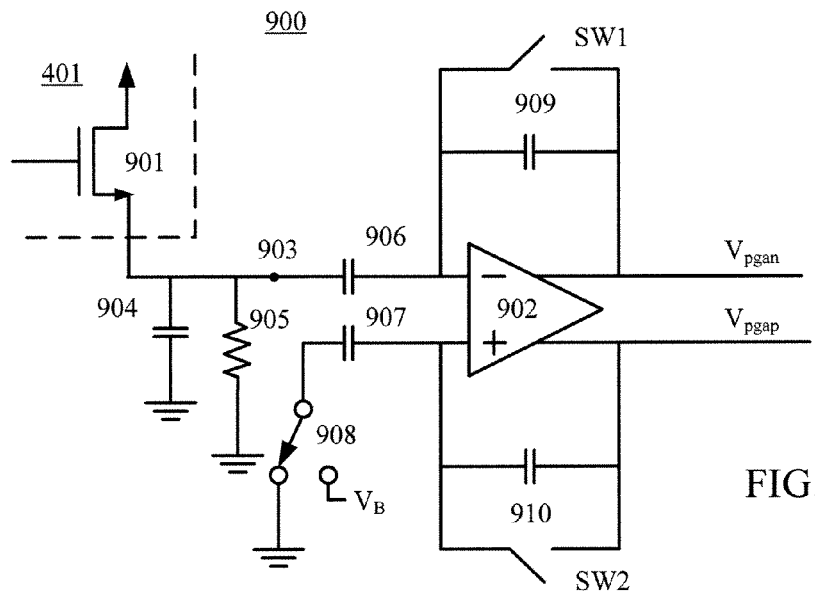
FIG. 9A illustrates an exemplary CDS circuit that can be configured in a reset mode or a sampling mode.

FIG. 9A illustrates an exemplary CDS circuit 900 that can be configured in a reset mode or a sampling mode. Circuit 900 includes a programmable gain amplifier (PGA) 902, which receives inputs via positive and negative input terminals and generates outputs $V_{pgan}$ and $V_{pgap}$ for an ADC. A transistor 901, which forms part of TDI sensor 401 (FIG. 4), is connected between a high voltage source (e.g. VDD) and a node 903. The gate of transistor 901 receives a voltage proportional to the detected signal on the sensor; therefore, its output (provided to node 903) is also proportional to the signal on the sensor. A capacitor 904 and a resistor 905 are each connected between node 903 and ground. A capacitor 906 is connected between node 903 and the negative input terminal of PGA 902. A capacitor 907 is connected between a switch 908 and the positive input terminal of PGA 902. A feedback capacitor 909 and a switch SW1 are connected in parallel to the negative input and output terminals of PGA 902. A feedback capacitor 910 and a switch SW2 are connected in parallel to the positive input and output terminals of PGA 902.

During the reset mode (with switches SW1 and SW2 closed and switch 908 connected to ground), the DC level (blank level) is mapped to a zero differential voltage at the output of PGA 902. During the sampling mode (with switches SW1 and SW2 open and switch 908 connected to a programmable bias voltage $V_B$, e.g. 1.2V), the deviation of the voltage at node 903 generates charges proportional to that voltage and is transferred to feedback capacitors 909 and 910 and in turn is converted to a differential voltage at the output of PGA 902. In the above-described configuration of CDS circuit 900, feedback capacitors 909 and 910 are effectively programmable (e.g. via switches SW1 and SW2) and their values can change the voltage gain of PGA 902 (in an inversely proportional manner). Note that when no light is detected by the sensor, bias voltage $V_B$ can be programmed to be close to one extreme (minus full value). When half a maximum signal is detected, bias voltage VB can be programmed to be close to zero. When a full signal is detected, bias voltage $V_B$ can be programmed to be close to the other extreme (plus full value), thereby effectively doubling the signal swing.

Figure 9B:
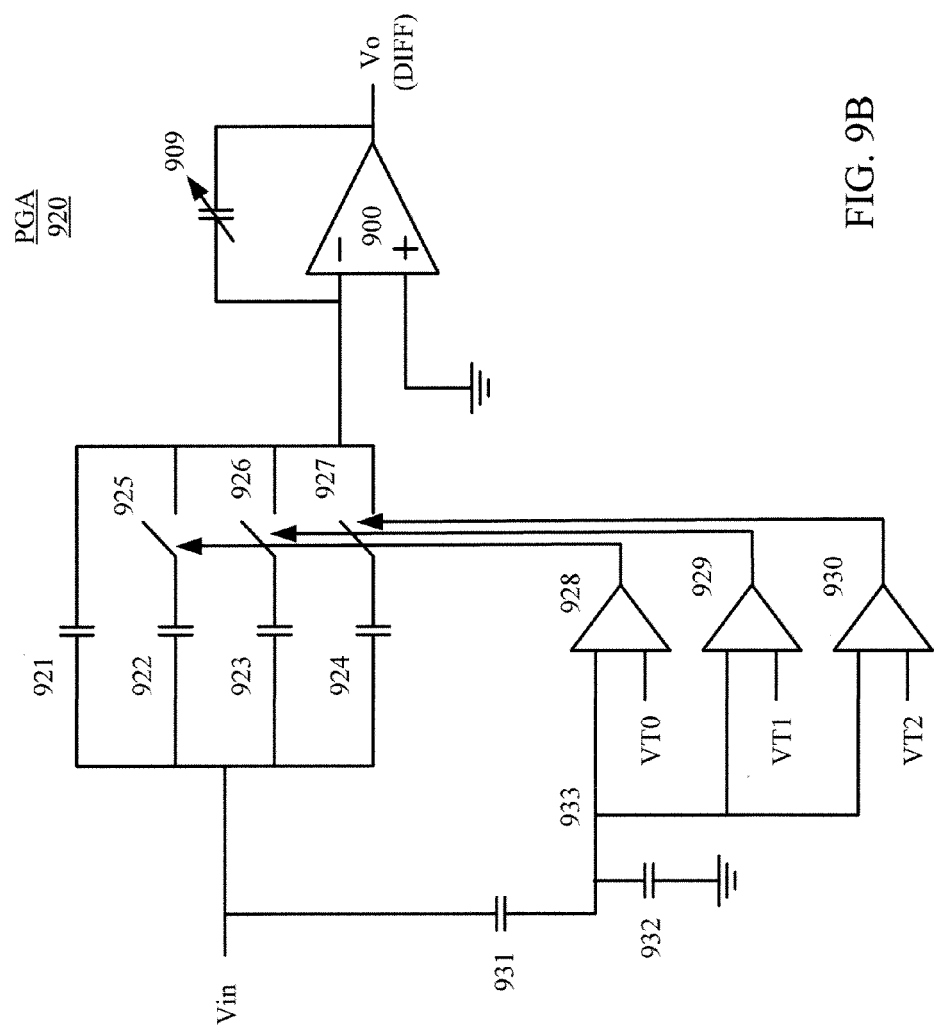
FIG. 9B illustrates an exemplary programmable gain amplifier 920 that can form part of an AFE for the HDD.

FIG. 9B illustrates a simplified exemplary controlled non-linear response programmable gain amplifier 920 that can form part of an AFE for the HDD. Note that Vin, the input to PGA 920, has an associated AC signal having a "swing" that can be measured. To get good performance from the upstream sensor, Vin must also supply some current load to the sensor. In this embodiment, that current can be provided by a switching capacitance network. In this embodiment, a plurality of input capacitors 921-924 are connectable in parallel between an input voltage Vin and a negative input terminal of amplifier 900 (see FIG. 9A for details). The positive input terminal of amplifier 900 is connected to ground. Capacitors 922-924 can be selectively disconnected from amplifier 900 using switches 925-927, respectively. Switches 925-927 are controlled by comparators 928-930, respectively. Comparators 928-930 receive threshold voltages VT0-VT3, respectively, on their first input terminals and a voltage from a node 933 on their second input terminals. A capacitor 932 is connected between node 933 and ground, whereas a capacitor 931 is connected between node 933 and the input voltage Vin.

After a reset of PGA 920 and initially during the sampling mode, switches 925-927 are closed. This configuration generates a maximum gain for amplifier 900, which is computed as the ratio of the total parallel capacitance of capacitors 921-924 (i.e. their summed capacitances) to the capacitance of its programmable capacitor (i.e. capacitor 909, FIG. 9A). In other words, amplifier 900 has a gain defined by the ratio of its input capacitance and its feedback capacitance. An input signal Vin is initially low, but transitions higher over time until the next reset (wherein a reset is triggered for the sampling of each pixel). During that time, amplifier 900 is effectively integrating that signal and generating a voltage Vo for an ADC.

As the input signal Vin transitions higher, comparators 928-930 are comparing that rising signal to their threshold voltages VT0-VT2, wherein VT0<VT1<VT2. Once the signal at node 933 reaches each of the threshold voltages, comparators 928-930 will trigger switches 925-927 to consecutively open at the appropriate time. Thus, the maximum gain of amplifier 900 is provided with all switches 925-927 closed and this gain is reduced over time based on the number of switches that are open. Reducing the gain, in turn, reduces the output voltage Vo. Therefore, PGA 920 can reduce the voltage swing of input voltage Vin using the negative feedback provided by the feedback capacitor 909 and the switchable capacitors 922-927. The gain for PGA 920 can be defined by $C_{IN}/C_{FB}$, wherein $C_{IN}$=921+922+923+924 (i.e. the sum of the capacitances of all parallel-connected input capacitors) and $C_{FB}$ is the feedback capacitance of capacitor 909. Thus, when an input capacitor is removed (i.e. its corresponding switch being opened), the gain of PGA 920 decreases for any additional signal change thereafter.

Note that other known PGAs typically include resistors, which affect both the gain and the offset of the amplifier. Advantageously, by using capacitors in PGA 920 and ensuring that capacitors are switched out only (i.e. capacitors 922-924 are not added into the path), the gain of amplifier 900 can be changed without changing the offset. This feature is possible because a voltage change in Vin with capacitors 921-924 connected to the negative input terminal of amplifier 900 causes current to flow through those capacitors in one direction and at the same time causes current to flow in feedback capacitor 909 in the opposite direction. Therefore, switching a capacitor out of the path to the negative input terminal of amplifier 900, reduces the current, but not the charge. In this manner, spikes in the output voltage Vo are eliminated. Because output voltage Vo is being digitized with a maximum SNR desired, a glitch in Vo would render that signal unusable. Thus, PGA 920 is particularly beneficial for a digitizer (i.e. the ADC).

Note that CDS 900 and PGA 920 can be configured to output differential signals. Providing a differential signal instead of a single signal can provide advantages in a sensor system. For example, a single signal is typically understood to be relative to ground. However, ground may actually vary slightly across a chip. Therefore, a sensor receiving signals from different areas of the chip may require additional information to provide correct interpretation of those signals. In contrast, a differential signal has two signals, each of which is relative to the other. As a result, the HDD can be more noise immune (i.e. compared to using a single signal) when using multiple channels on one chip.

Figure 10:
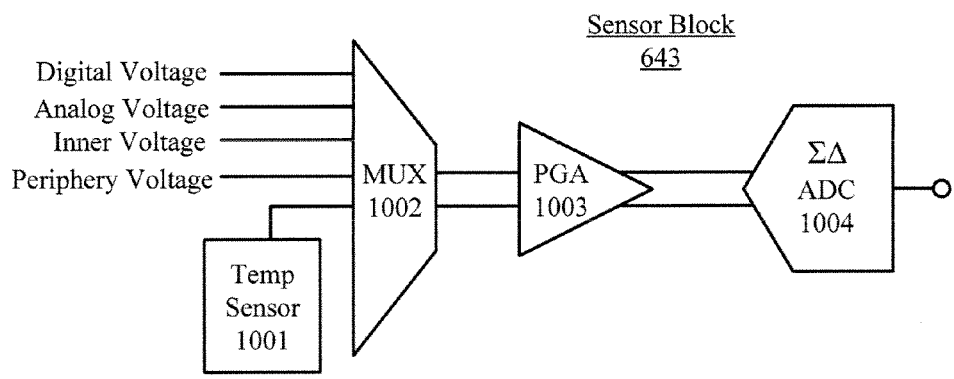
FIG. 10 illustrates an exemplary sensor block.

FIG. 10 illustrates an exemplary sensor block 643 (FIG. 6A) that can provide high accuracy, low speed (on the order of 10-100 signals per second), and low power results. In this embodiment, a PGA 1003, e.g. of conventional design, can receive inputs from a multiplexer 1002 and provides outputs to a sigma-delta ADC 1004. In one embodiment, sigma-delta ADC 1004 can generate an output, which is accessible by an off-chip device. Notably, multiplexer 1002 can receive a plurality of inputs, at least one of which can be a temperature sensor 1001 (depending on the size of the chip). Temperature sensor 1001 can include a transistor, a current source, or some other set of components for sensing temperature that generates a voltage output. In one embodiment, sensor block 643 can also monitor critical supply voltages, such as a digital supply voltage supplied to the chip, an analog input voltage supplied to the chip (which could be read out in analog format from a test pin, or converted by the on-chip sigma-delta ADC 1004 and then read out digitally), a voltage generated in an inner area of the chip, and/or a voltage generated in a periphery area of the chip. Thus, sensor block 643 can advantageously provide a diagnostic function for the chip including the HDD. As a result, a TDI sensor module including multiple HDDs (e.g. 16, 24, 36, 48, etc.) can provide a same number of temperature and voltage sensor indicators, thereby allowing temperature and voltage sensor outputs to be determined at a package level. In one embodiment, to provide additional result accuracy, sensor block 643 can use differential outputs of multiplexer 1002 and PGA 1003.

Figure 11:
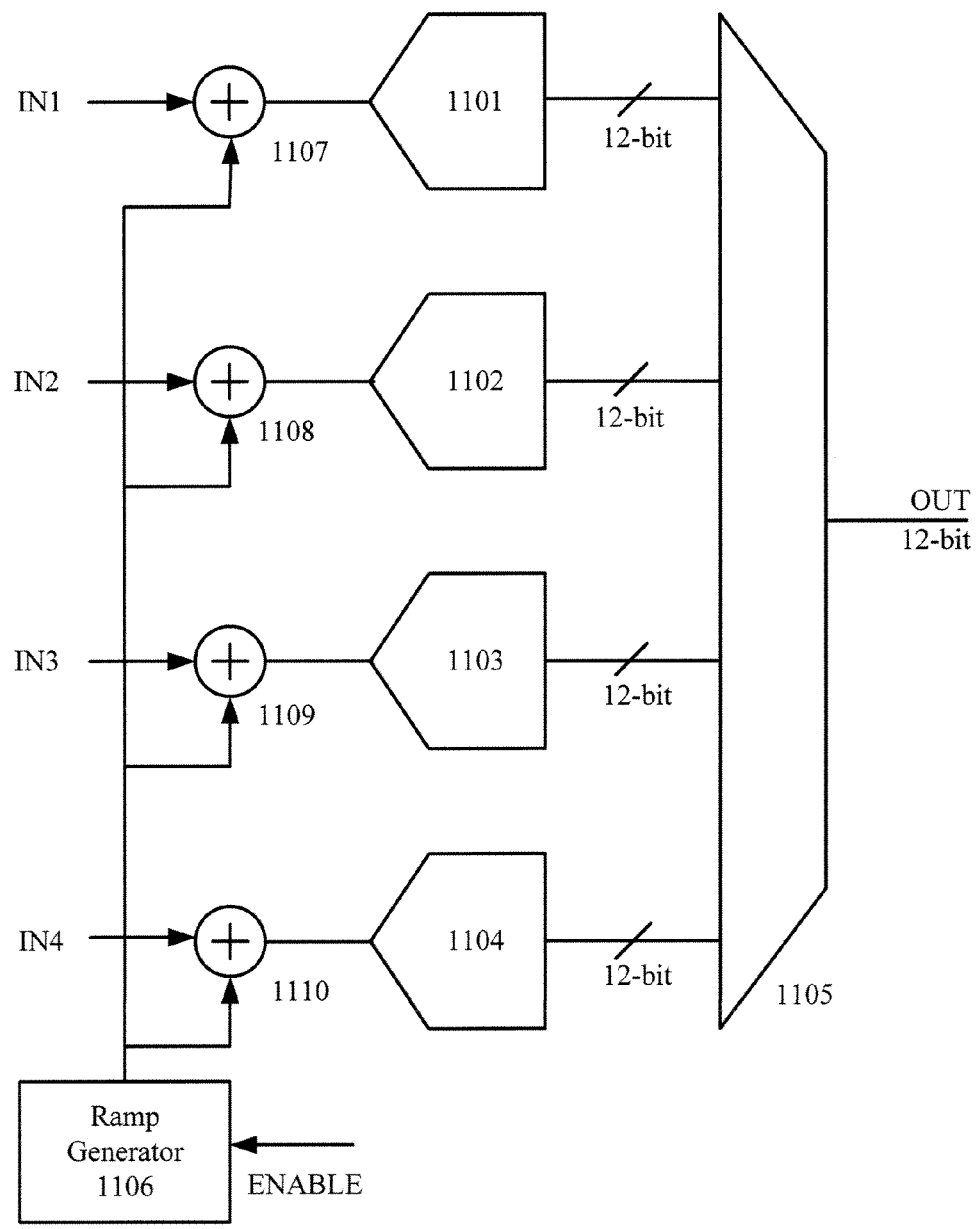
FIG. 11 illustrates an exemplary ADC auto-test configuration.

FIG. 11 illustrates an exemplary ADC auto-test configuration in which a ramp generator 1106, when enabled using an internally-generated signal ENABLE, provides a digital ramp (i.e. saw tooth) signal to adders 1107-1110. Adders 1107-1110 also receive independent inputs IN1-IN4, respectively. In one embodiment, inputs IN1-IN4 can be the channel inputs described above. The sums of adders 1107-1110 are provided to ADCs 1101-1104, respectively, which in turn provide bit outputs to a multiplexer 1105. In one embodiment, the ramp signal of ramp generator 1106 is a 10-bit signal and each independent input IN1-IN4 is a 2-bit signal, thereby resulting in both adders 1107-1110 and ADCs 1101-1104 outputting 12-bit results. A control signal provided by internal control logic can select which ADC result to output as the OUT signal (logically, a 12-bit signal). Notably, even in the absence of an actual channel input, the configuration of FIG. 11 allows ADCs 1101-1104 to be tested.

Figure 12A:
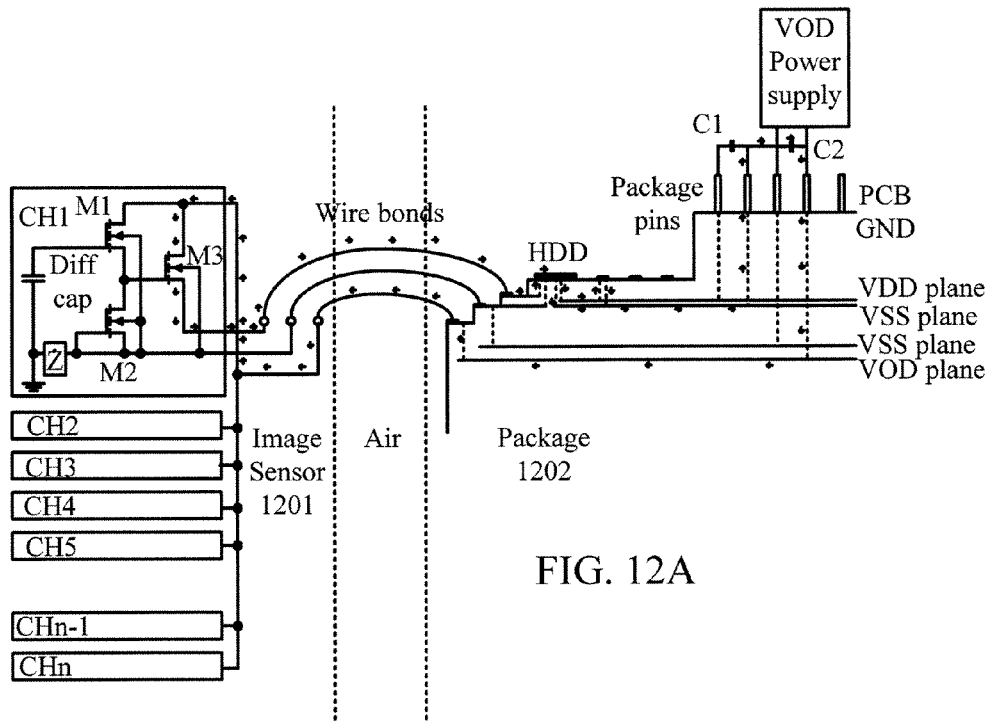
FIG. 12A illustrates exemplary signal and ground paths of an image sensor as well as the signal and DC current paths of a package without in-package capacitors.
Figure 12B:
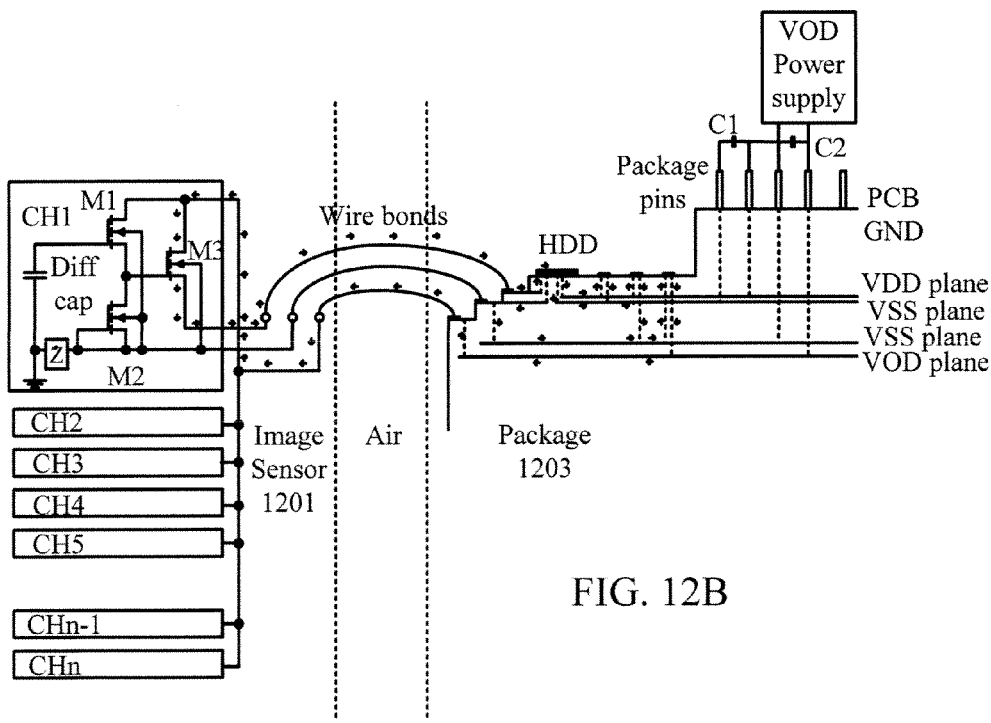
FIG. 12B illustrates exemplary signal and ground paths of an image sensor as well as the signal and DC current paths of a package with in-package capacitors.

FIG. 12A illustrates exemplary signal and ground paths of an image sensor 1201 (including components for generating channels CH1-CHn, wherein n is an integer and wherein a set of sensor components to generate a channel can include transistors M1-M3, connected as shown in FIG. 12A) as well as the signal and DC current paths of a package 1202 without in-package capacitors. In FIG. 12A, these paths are indicated using arrows. In the embodiment shown, image sensor 1201 and package 1202 can be connected using wire bonds in an air medium. In other embodiment, wire bonds in epoxy can be used. In either embodiment, the bonding can also include flip chip bonding (i.e. solder bumps connecting to pads), which is well known. Note that in an actual embodiment, image sensor 1201 can be supported by package 1202 (e.g. the edges only of image sensor 1201 can be supported by a "frame" package), but are shown separately in FIG. 12A for simplicity. In contrast, FIG. 12B illustrates exemplary signal and ground paths of image sensor 1201 as well as the signal and DC current paths of a package 1203 with in-package capacitors.

In package 1202 (without in-package capacitors), the signal path (i.e. current) extends outside package 1202 to the VDD power supply and then back to sensor 1201 to provide power to sensor 1201. This signal path is the same for both DC and high frequency current. Notably, having high frequency signals traveling that far (e.g. on the order of 10-30 cm) is quite problematic and can result in significant performance degradation. This degradation can include ground voltages (AVSS and VSS planes, for example) that fluctuate. In contrast, in package 1203 (with in-package capacitors C1 and C2), the current path is localized within package 1203 (e.g. on the order of 1-2 cm). This shortened path, compared to that of package 1202, can advantageously ensure good performance, e.g. ensuring consistent, stable reference voltages.

In one embodiment, the ADCs of the device can be calibrated using an internally generated reference, or can use a reference from an external connection. In the later case, multiple devices can be connected together with this connection and calibrated to the same to reference for high precision measurements. On-chip logic is designed support calibrations of either type in the preferred embodiment The embodiments described herein are not intended to be exhaustive or to limit the invention to the precise forms disclosed. As such, many modifications and variations will be apparent. For example, in one embodiment, multiple analog signals can be encoded or mixed before digital conversion, and composite digital data can then be decoded for improved signal-to-noise ratio. In another embodiment, multiple digital samples can be taken per pixel (multisampling), thereby minimizing effects of timing jitter for improved signal recovery. In yet another embodiment, digital data can be locally stored and processed for calibration, compression, and pre-processing. In yet another embodiment, the results from adjacent channels and a "history" of channel values can be used to provide real time control of the analog and digital processing. In yet another embodiment, a signal level can be monitored, wherein when the signal level exceeds a predetermined threshold, the gain can be reduced to maintain headroom if the signal increases further (and when the signal level falls below another predetermined threshold, the gain can be increased while maintaining calibrations). The HDD can further include a precision timing delay control to adjust the reset and sampling clock of the ADC. This delay is controlled by digital block. The timing control circuit can include a reliable voltage supply generated internally through a regulator to achieve a very low timing jitter requirement for the HDD. The HDD can further include analog multiplexer to read exact DC voltage of the image sensor outputs for optimum setting of the resistor and bias current.

In yet another embodiment, some local processing to perform defect detection can be performed. For example, in designs with highly repetitive features, adjacent features can be compared, wherein adjacent defect-free features should be identical. In one embodiment, defect detection can include subtracting the image of one feature from the image of the adjacent feature, and indicating a defect is detected only when the difference of the images exceeds a predetermined threshold. Output data generation can be entirely disabled or highly compressed when the difference data is below a predetermined threshold.

Figure 13:
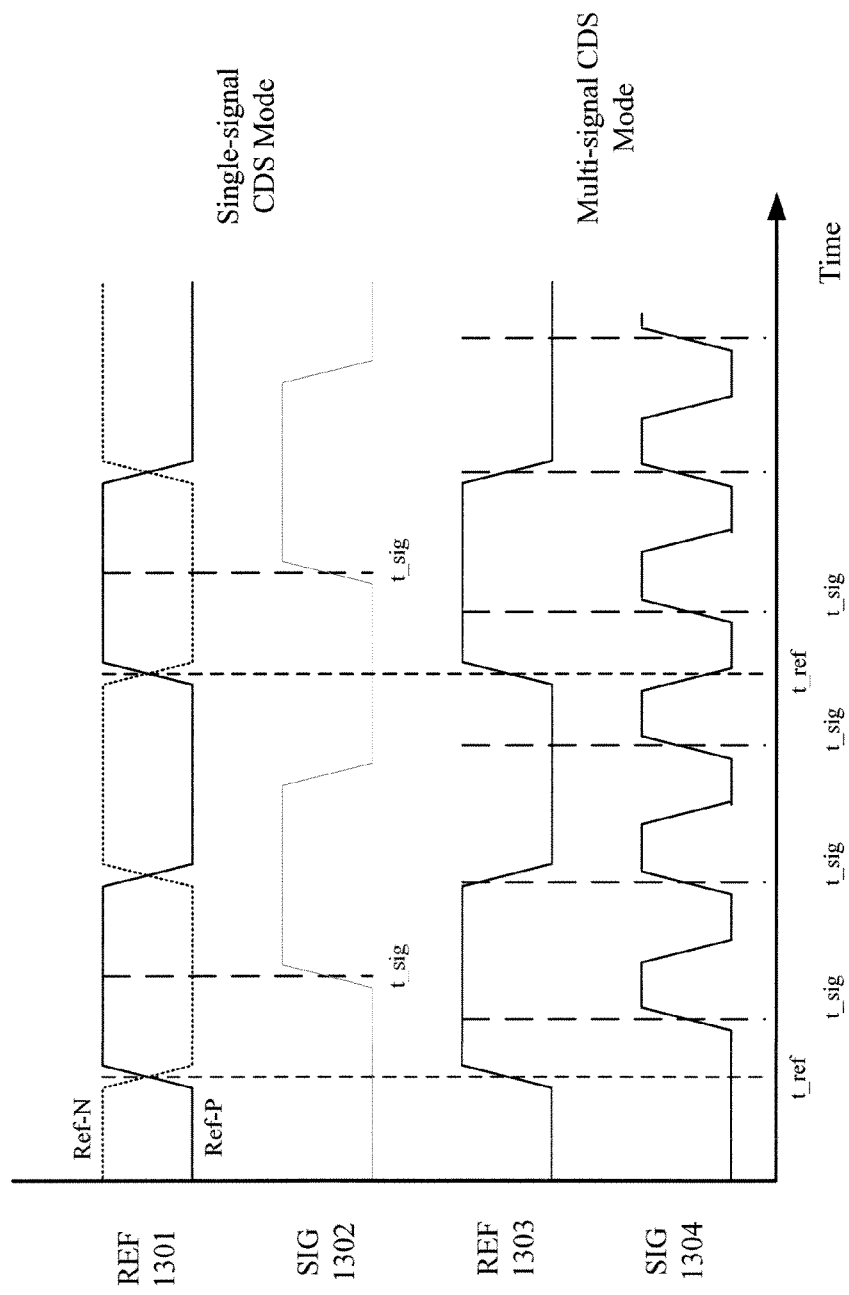
FIG. 13 compares conventional single-signal and multi-signal CDS modes.

FIG. 13 compares conventional single-signal and multi-signal CDS modes. In the conventional single-signal CDS mode, REF 1301 and SIG 1302 waveforms define the reference and signal clocks with one reference and one sample per digital readout. In the multi-signal CDS mode, REF 1303 is the same as REF 1301, which SIG 1304 clocking produces multiple sample measurements and digital readouts, each readout relative to the reference value collected at t_ref. Note that all timing signals may be implemented as differential pairs as shown in REF 1301.

Figure 14:
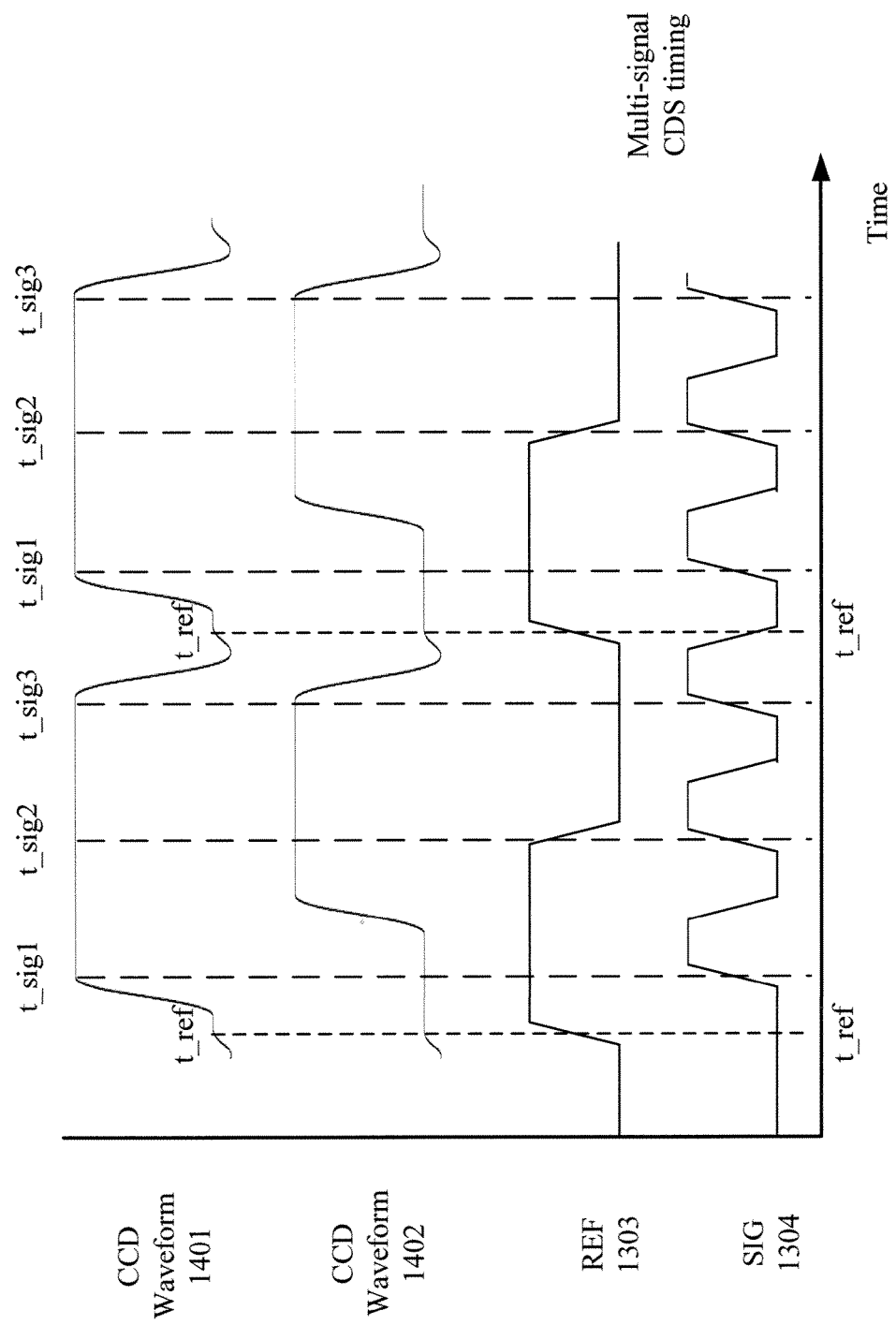
FIG. 14 illustrates that a CCD sensor can be timed to produce different waveforms for the same image signal.

In contrast, FIG. 14 illustrates that a CCD sensor can be timed to produce different waveforms for the same image signal. In this case, CCD waveform 1401 can be used to collect three signal measurements, all relative to the reference sample (REF 1303). CCD waveform 1402 can be used to collect two reference levels and two signal samples, where the measurement at t_sig1 is relative to the first reference measurement, and would be 0 counts for an ideal system with no noise sources. Because clocking of the CDS circuit can be reconfigurable, one reset and multiple readings can advantageously provide averaging and increase the system SNR.

Accordingly, it is intended that the scope of the invention be defined by the following claims and their equivalents.

The invention claimed is:

1. A module for high speed image processing, the module comprising:
   an image sensor for generating a plurality of analog outputs representing an image; and
   a plurality of high density digitizers (HDDs) for concurrently processing the plurality of analog outputs, each HDD being an integrated circuit, each HDD for processing in parallel a predetermined set of the plurality of analog outputs representing a portion of the image, and each channel of the HDD including:
      an analog front end (AFE) for conditioning a differential signal representing one analog output and generating a conditioned signal, the AFE including a programmable gain amplifier (PGA) with switch-out capacitors; and
      an analog-to-digital converter (ADC) for converting the conditioned signal into a digital signal, the digital signal being provided for the high speed image processing.

2. The module of claim 1, wherein the image sensor includes a time delay integration (TDI) sensor.

3. The module of claim 1, wherein the image sensor is configured to sense a range of wavelengths from deep ultraviolet through visible radiation.

4. The module of claim 1, wherein the PGA includes a plurality of comparators for determining when each of the switch-out capacitors is to be disconnected from an input of the PGA.

5. The module of claim 1, wherein the AFE further includes a correlated double sampling (CDS) circuit with offset control to optimize dynamic range.

6. The module of claim 1, each channel further including a data formatting block for receiving the digital signal and configured to provide black-level correction.

7. The module of claim 1, each channel further including a low voltage differential signaling (LVDS) block for receiving the digital signal and providing transport of LVDS-processed signals to an off-chip device.

8. The module of claim 1, wherein each HDD further includes a control block for enabling/disabling a calibration mode and a test mode.

9. The module of claim 8, wherein the control block includes a ramp generator for providing a ramp signal to each ADC.

10. The module of claim 8, wherein the control block includes self-test logic configured to introduce a predetermined ramp function to each channel and monitor output pins of the HDD for deviations from the predetermined ramp function.

11. The module of claim 8, wherein the control block includes self-test logic configured to introduce a DC value to each channel and monitor output pins of the HDD for noise on each channel.

12. The module of claim 8, wherein the control block includes self-test logic configured to introduce a known signal pattern to each channel and monitor output pins of the HDD to determine when the known signal pattern starts and ends.

13. The module of claim 1, wherein each HDD further includes a data rate multiplier phase locked loop (PLL) configured to provide a square wave to which all channel outputs are phase locked.

14. The module of claim 1, wherein each HDD further includes a sensor block for selectively accessing a digital input voltage, an inner chip voltage, a peripheral chip voltage, and a temperature sensor voltage.

15. A module for high speed image processing, the module comprising:
   an image sensor for generating a plurality of analog outputs representing an image; and
   a plurality of high density digitizers (HDDs) for concurrently processing the plurality of analog outputs, each HDD being an integrated circuit, each HDD for processing in parallel a predetermined set of the plurality of analog outputs representing a portion of the image, and each channel of the HDD including:
      an analog front end (AFE) for conditioning one analog output and generating a conditioned signal;
      an analog-to-digital converter (ADC) for converting the conditioned signal into a digital signal; and
      an analog driver coupled to bypass the ADC and provide the conditioned signal to an off-chip device.

16. The module of claim 15, wherein the AFE includes a programmable gain amplifier (PGA) and a correlated double sampling (CDS) circuit, each of the PGA and the CDS circuit including switchable capacitors.

17. The module of claim 16, wherein the PGA includes a plurality of comparators for determining when each of the switchable capacitors is to be disconnected from an input of the PGA.

18. The module of claim 16, wherein the CDS circuit has an offset control to optimize dynamic range.

19. The module of claim 15, wherein each HDD further includes a digital control block for enabling/disabling the analog driver.

20. The module of claim 15, wherein the image sensor includes a time delay integration (TDI) sensor.

21. The module of claim 15, wherein the image sensor is configured to sense a range of wavelengths from deep ultraviolet through visible radiation.

22. The module of claim 15, each channel further including a data formatting block for receiving the digital signal and configured to provide black-level correction.

23. The module of claim 15, each channel further including a low voltage differential signaling (LVDS) block for receiving the digital signal and providing transport of LVDS-processed signals to an off-chip device.

24. The module of claim 15, wherein each HDD further includes a control block for enabling/disabling a calibration mode and a test mode.

25. The module of claim 24, wherein the control block includes a ramp generator for providing a ramp signal to each ADC.

26. The module of claim 15, wherein each HDD further includes a sensor block for selectively accessing a digital input voltage, an inner chip voltage, a peripheral chip voltage, and a temperature sensor voltage.

27. A module for high speed image processing, the module comprising:
an image sensor for generating a plurality of analog outputs representing an image; and
a plurality of high density digitizers (HDDs) for concurrently processing the plurality of analog outputs, each HDD being an integrated circuit, each HDD for processing in parallel a predetermined set of the plurality of analog outputs representing a portion of the image, and each channel of the HDD including:
an analog front end (AFE) for conditioning one analog output; and
an analog-to-digital converter (ADC) for converting a conditioned signal into a digital signal; and
each HDD further including a register control block for providing general and channel configuration bits to the HDD, the register control block providing interlinking of the plurality of HDDs.

28. The module of claim 27, wherein the AFE includes a programmable gain amplifier (PGA) and a correlated double sampling (CDS) circuit, each of the PGA and the CDS circuit including switchable capacitors.

29. The module of claim 28, wherein the PGA includes a plurality of comparators for determining when each of the switchable capacitors is to be disconnected from an input of the PGA.

30. The module of claim 28, wherein the CDS circuit has an offset control to optimize dynamic range.

31. The module of claim 27, wherein the image sensor includes a time delay integration (TDI) sensor.

32. The module of claim 27, wherein the image sensor is configured to sense a range of wavelengths from deep ultraviolet through visible radiation.

33. The module of claim 27, each channel further including a data formatting block for receiving the digital signal and configured to provide black-level correction.

34. The module of claim 27, each channel further including a low voltage differential signaling (LVDS) block for receiving the digital signal and providing transport of LVDS-processed signals to an off-chip device.

35. The module of claim 27, wherein each HDD further includes a control block for enabling/disabling a calibration mode and a test mode.

36. The module of claim 35, wherein the control block includes a ramp generator for providing a ramp signal to each ADC.

37. The module of claim 27, wherein each HDD further includes a sensor block for selectively accessing a digital input voltage, an inner chip voltage, a peripheral chip voltage, and a temperature sensor voltage.

38. A system for high speed image processing, the system comprising a plurality of modules, each module comprising:
an image sensor for generating a plurality of analog outputs representing an image; and
a plurality of high density digitizers (HDDs) for concurrently processing the plurality of analog outputs, each HDD being an integrated circuit, each HDD for processing in parallel a predetermined set of the plurality of analog outputs representing a portion of the image, and each channel of the HDD including:
an analog front end (AFE) for conditioning one analog output; and
an analog-to-digital converter (ADC) for converting a conditioned signal into a digital signal,
wherein the plurality of HDDs are connected for electively providing general and channel configuration bits to the plurality of HDDs.

39. The system of claim 38, further including a package for securing the image sensor and the plurality of HDDs, wherein the image sensor and the plurality of HDDs are coupled using wire bonds, and wherein the package includes in-package capacitors.

* * * * *